(12) United States Patent
Ootsuka et al.

(10) Patent No.: US 11,718,569 B2
(45) Date of Patent: Aug. 8, 2023

(54) PRODUCTION METHOD FOR COMPOSITE MATERIAL

(71) Applicant: IHI Corporation, Tokyo (JP)

(72) Inventors: Yuuta Ootsuka, Tokyo (JP); Yasutomo Tanaka, Tokyo (JP); Hisato Inoue, Tokyo (JP); Wataru Kubota, Tokyo (JP); Masato Ishizaki, Tokyo (JP); Yasuyuki Fukushima, Tokyo (JP); Izumi Matsukura, Tokyo (JP)

(73) Assignee: IHI Corporation, Tokyo (JP)

( * ) Notice: Subject to any disclaimer, the term of this patent is extended or adjusted under 35 U.S.C. 154(b) by 0 days.

(21) Appl. No.: 17/106,854

(22) Filed: Nov. 30, 2020

(65) Prior Publication Data
US 2021/0078910 A1 Mar. 18, 2021

Related U.S. Application Data

(63) Continuation of application No. PCT/JP2019/021761, filed on May 31, 2019.

(30) Foreign Application Priority Data

Jun. 1, 2018 (JP) .................................. 2018-106068

(51) Int. Cl.
*C04B 35/628* (2006.01)
*C04B 35/80* (2006.01)
(Continued)

(52) U.S. Cl.
CPC .. *C04B 35/62863* (2013.01); *C04B 35/62884* (2013.01); *C04B 35/80* (2013.01);
(Continued)

(58) Field of Classification Search
CPC ........ C04B 35/62863; C04B 35/62884; C04B 35/80; C04B 2235/3826;
(Continued)

(56) References Cited

U.S. PATENT DOCUMENTS

| 4,044,109 A | * | 8/1977 | Kotzsch | .................. C01B 33/04 |
|---|---|---|---|---|
| | | | | 423/342 |
| 5,738,908 A | * | 4/1998 | Rey | ......................... C04B 35/80 |
| | | | | 427/249.2 |

(Continued)

FOREIGN PATENT DOCUMENTS

| CN | 203200179 U | 9/2013 | |
|---|---|---|---|
| EP | 1260729 A1 * | 11/2002 | ........... C04B 35/565 |

(Continued)

OTHER PUBLICATIONS

Suzuki, K., et al., "Fabrication and Characterization of 3D Carbon-fiber/SiC Composites by Slurry—Pulse CVI Joint Process," Key Engineering Materials, 1999, vol. 164-165, p. 1-9.

(Continued)

*Primary Examiner* — Michael B Cleveland
*Assistant Examiner* — Michael G Miller
(74) *Attorney, Agent, or Firm* — Volpe Koenig

(57) ABSTRACT

A production method for a composite material, which includes a porous substrate and a silicon carbide film formed on a surface of a material forming the porous substrate, includes causing a silicon source containing a silicon atom, a chlorine source containing a chlorine atom, and a carbon source containing a carbon atom to react with each other to form the silicon carbide film on the surface of the material forming the porous substrate.

7 Claims, 5 Drawing Sheets

(51) Int. Cl.
   *C23C 16/04*    (2006.01)
   *C23C 16/32*    (2006.01)
   *D06M 11/77*    (2006.01)

(52) U.S. Cl.
   CPC .......... *C23C 16/045* (2013.01); *C23C 16/325* (2013.01); *D06M 11/77* (2013.01); *C04B 2235/3826* (2013.01); *C04B 2235/5244* (2013.01); *C04B 2235/614* (2013.01)

(58) Field of Classification Search
   CPC ...... C04B 2235/5244; C04B 2235/614; C04B 35/565; C04B 35/62897; C04B 41/87; C23C 16/045; C23C 16/325; C23C 16/4488; D06M 11/77; C01B 32/963; C01B 32/984
   See application file for complete search history.

(56) References Cited

U.S. PATENT DOCUMENTS

| | | | |
|---|---|---|---|
| 6,368,663 B1* | 4/2002 | Nakamura | C04B 35/565 |
| | | | 427/248.1 |
| 2002/0176990 A1 | 11/2002 | Johnson | |
| 2014/0065800 A1* | 3/2014 | Kawada | C30B 25/02 |
| | | | 438/478 |
| 2014/0130742 A1* | 5/2014 | Kang | C23C 16/4488 |
| | | | 118/724 |
| 2014/0319545 A1 | 10/2014 | Kang | |
| 2017/0341986 A1* | 11/2017 | Hinoki | C04B 35/62863 |

FOREIGN PATENT DOCUMENTS

| | | |
|---|---|---|
| EP | 2896718 A1 | 7/2015 |
| EP | 2899176 A1 | 7/2015 |
| JP | 2002-029846 A | 1/2002 |
| JP | 2012-178443 A | 9/2012 |
| JP | 5906318 B2 | 4/2016 |

OTHER PUBLICATIONS

Nakagawa, M., "The Preparation of High Purity Silicon by the Reduction of the Silicon Tetrachloride with Hydrogen," The Journal of the Society of Chemical Industry, vol. 62, No. 2, p. 177-181, 1959.

International Search Report, PCT/JP2019/021761, dated Aug. 2, 20 019, 2 pgs.

Melnychuk G et al: "Effect of HCl addition on gas-phase and surface reactions during homoepitaxial growth of SiC at low temperatures", Journal of Applied Physics, American Institute of Physics, 2 Huntington Quadrangle, Melville, NY 11747, vol. 104, No. 5, p. 53517-53517, Sep. 10, 2008 (Sep. 10, 2008).

* cited by examiner

PRODUCTION METHOD FOR COMPOSITE MATERIAL

CROSS-REFERENCE TO RELATED APPLICATIONS

This application is a Continuation Application based on International Application No. PCT/JP2019/021761, filed on May 31, 2019, which claims priority on Japanese Patent Application No. 2018-106068, filed on Jun. 1, 2018, the contents of which are incorporated herein by reference.

TECHNICAL FIELD

The present disclosure relates to a production method for a composite material.

BACKGROUND

Ceramic matrix composites (CMCs) are known as high-strength and high-temperature materials and lightweight materials and are expected as alternatives to nickel-based alloys. For example, by applying the CMC to high-temperature portions of aircraft jet engines, weight reduction and low-fuel consumption of the engine can be expected. When the CMC is applied to the high-temperature portions of the aircraft jet engines, it is effective to use silicon carbide having excellent heat resistance as a matrix.

As a production method for a composite material such as CMC, a method is known of forming a silicon carbide film by depositing silicon carbide on a surface of each fiber of a fiber substrate using a chemical vapor deposition (CVD) method or a chemical vapor infiltration (CVI) method. Patent Document 1 proposes a method of allowing a raw material gas such as $CH_3SiCl_3$ (MTS) or $SiCl_4$, a carrier gas such as $H_2$ or He, and an additive gas such as $C_2H_6$ or $C_2H_4$ to flow into a reaction furnace and forming the silicon carbide film on the surface of the fiber using the CVD method or the CVI method.

Document of Related Art

Patent Document

[Patent Document 1] Japanese Patent No. 5906318

SUMMARY

In the related art disclosed in Patent Document 1, since the infiltratability of silicon carbide into the fiber substrate is low, in order to ensure the uniformity of the silicon carbide film formed on the surface of each fiber, it is required to reduce the growth rate of the silicon carbide film. Therefore, it is necessary to take about 100 to 200 hours to produce the composite material, and the productivity thereof is low.

An object of the present disclosure is to provide a production method for a composite material capable of producing a composite material with high productivity while ensuring uniformity of a silicon carbide film formed on a surface of a material forming a porous substrate such as a fiber substrate.

According to an aspect of the present disclosure, a production method for a composite material, which includes a porous substrate and a silicon carbide film formed on a surface of a material forming the porous substrate, includes causing a silicon source containing a silicon atom, a chlorine source containing a chlorine atom, and a carbon source containing a carbon atom to react with each other to form the silicon carbide film on the surface of the material.

In the production method for a composite material according to the aspect, a product generated by bringing the silicon source into contact with the chlorine source may react with a gas of the carbon source.

In the production method for a composite material according to the aspect, the product may be a gas containing $SiCl_2$ or $SiCl$.

In the production method for a composite material according to the aspect, the silicon source may be a solid silicon and the chlorine source may be a $Cl_2$ gas.

In the production method for a composite material according to the aspect, the silicon carbide film may be formed by the reaction using a chemical vapor deposition method or a chemical vapor infiltration method.

In the production method for a composite material according to the aspect, a reaction pressure for forming the silicon carbide film may be 0.1 to 20 Torr (13 to 2660 Pa). In the production method for a composite material according to the aspect, the carbon source may be at least one hydrocarbon of $CH_4$, $C_2H_6$, $C_3H_8$, $C_2H_4$, $C_2H_2$, $C_6H_6$, and $CCl_4$.

In the production method for a composite material according to the aspect, the porous substrate may be a fiber substrate including a plurality of fibers.

In the production method for a composite material according to the aspect, the fiber may be a silicon carbide fiber.

According to the production method for a composite material of the present disclosure, the uniformity of the silicon carbide film formed on the surface of the material forming the porous substrate such as a fiber substrate is excellent, and the composite material can be produced with high productivity.

DESCRIPTION OF EMBODIMENTS

Figure 1:
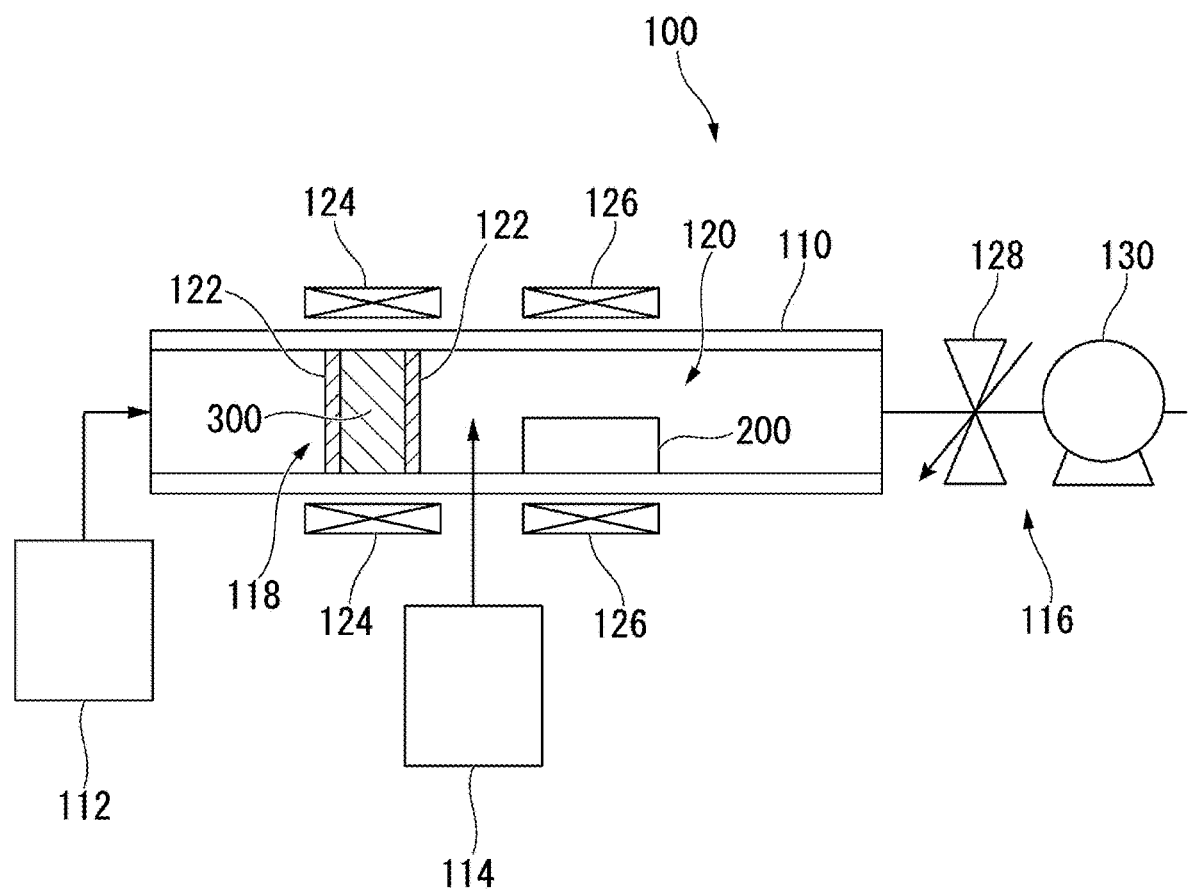
FIG. 1 is a schematic view showing an example of a manufacturing apparatus used in a production method for a composite material of the present disclosure.

A production method for a composite material of the present disclosure is a method of producing a composite material which includes a porous substrate and a silicon carbide film (SiC film) formed on a surface of a material forming the porous substrate. In the production method for a composite material of the present disclosure, a silicon source gas containing $SiCl_2$ or $SiCl$ and a carbon source gas containing a carbon atom react with each other to form the silicon carbide film on the surface of the material forming the porous substrate.

In the present disclosure, the silicon carbide film may be formed on the surface of the material forming the porous substrate using a chemical vapor deposition (CVD) method or a chemical vapor infiltration (CVI) method.

The silicon source gas containing $SiCl_2$ or $SiCl$ is obtained by, for example, bringing a silicon source containing a silicon atom into contact with a chlorine source containing a chlorine atom.

Hereinafter, an example of an embodiment of the production method for a composite material will be described.

In the production method for a composite material of the present embodiment, a silicon source containing a silicon atom, a chlorine source containing a chlorine atom, and a carbon source containing a carbon atom react with each other to form a silicon carbide film on a surface of a material forming a porous substrate.

Examples of the material forming the porous substrate include fiber, powder, and the like. As the material forming the porous substrate, only the fiber may be used, only the powder may be used, or a mixed material of fiber and powder may be used.

When a ceramic matrix composite (CMC) is produced by using the production method of the present disclosure, a fiber substrate including a plurality of fibers is used as the porous substrate. A substrate in which powder is attached to the fibers in the fiber substrate may also be used as the porous substrate.

Examples of the fiber include a silicon carbide fiber, an alumina fiber, a carbon fiber, a glass fiber and the like. The silicon carbide fiber may be used as the fiber from the viewpoint of excellent heat resistance. As the fiber, one type of the fiber may be used alone, or two or more types thereof may be used in combination.

The form of the fiber substrate is not particularly limited, and examples thereof include a textile fabric. A fiber bundle in which a plurality of fibers are bundled may be used in the fiber substrate, or a fiber substrate containing no fiber bundle may be used.

The shape of the fiber substrate is not particularly limited, and can be appropriately selected depending on applications.

As the powder forming the porous substrate, one type of the powder may be used alone, or two or more types thereof may be used in combination.

In the present disclosure, from the viewpoint of both ensuring uniformity and achieving productivity of the silicon carbide film formed on the surface of the material forming the porous substrate, the silicon source and the chlorine source may be brought into contact with each other, and then the resultant product may react with the gas of the carbon source. The silicon source that is brought into contact with the chlorine source does not contain the chlorine atom. The chlorine source may contain the silicon atom or the carbon atom.

Examples of the chlorine source include gases such as $Cl_2$ gas, $SiCl_4$ gas, and MTS gas. The $Cl_2$ gas may be used as the chlorine source from the viewpoint that the $Cl_2$ gas does not contain a carbon atom (in this case, the carbon source can be separately supplied in a free amount ratio). As the chlorine source, one type of the chlorine source may be used alone, or two or more types thereof may be used in combination.

A product generated by bringing the silicon source and the chlorine source into contact with each other may be a gas containing $SiCl_2$ or $SiCl$. This gas is used as the silicon source gas for forming the silicon carbide film on the porous substrate.

As a method for generating the gas containing $SiCl_2$ or $SiCl$, a method in which the chlorine source gas is brought into contact with the solid silicon may be used. By etching the solid silicon with the chlorine source gas, a gas containing $SiCl_2$ or $SiCl$ is generated. As a method for generating the gas containing $SiCl_2$ or $SiCl$, a method in which the $Cl_2$ gas is brought into contact with the solid silicon may be used.

The silicon source gas as the product may be a gas containing $SiCl_2$ gas and not containing $SiCl$ gas, or may be a gas containing both $SiCl_2$ gas and $SiCl$ gas. When the gas as the product contains the $SiCl$ gas, the gas also contains the $SiCl_2$ gas in thermodynamic theory. The gas containing $SiCl_2$ or $SiCl$ may contain a silicon source gas other than $SiCl_2$ and $SiCl$, such as $SiCl_3$ or $SiCl_4$.

When MTS is used as the chlorine source, there is a possibility that a small amount of MTS may remain in the product thereof, but the amount of MTS remaining after being brought into contact with the silicon source is small, and this does not affect the effect of the present disclosure.

When the product is the gas containing $SiCl_2$, the partial pressure of the $SiCl_2$ gas when the total pressure of the gas is 1 atm (0.1 MPa) can be appropriately set. For example, the partial pressure of the $SiCl_2$ gas can be set from the viewpoint of ensuring uniformity and achieving productivity of the silicon carbide film formed on the surface of each fiber. The partial pressure of the $SiCl_2$ gas may be an upper limit of a thermodynamic theoretical value thereof.

When the product is the gas containing $SiCl$, the partial pressure of the $SiCl$ gas when the total pressure of the gas is 1 atm (0.1 MPa) can be appropriately set. For example, the partial pressure of the $SiCl$ gas can be set from the viewpoint of ensuring uniformity and achieving productivity of the silicon carbide film formed on the surface of each fiber. The partial pressure of the $SiCl$ gas may be an upper limit of a thermodynamic theoretical value thereof.

The partial pressure of the $SiCl_2$ gas or the $SiCl$ gas in the gas as the product can be adjusted by a temperature at which the silicon source and the chlorine source are brought into contact with each other.

Examples of the carbon source include hydrocarbons such as $CH_4$, $C_2H_6$, $C_3H_8$, $C_2H_4$, $C_2H_2$, $C_6H_6$, and $CCl_4$. As the carbon source, one type of the carbon source may be used alone, or two or more types thereof may be used in combination.

The carbon source may be at least one hydrocarbon of $CH_4$, $C_2H_6$, $C_3H_8$, $C_2H_4$, $C_2H_2$, $C_6H_6$, and $CCl_4$.

A carrier gas may be optionally used for a reaction for forming the silicon carbide film in the present disclosure. Examples of the carrier gas include gases such as $H_2$ gas, $N_2$ gas, He gas, and Ar gas, which are inert to the film forming reaction. $H_2$ gas may be used as the carrier gas from the viewpoint of improving the infiltratability of silicon carbide into the fiber substrate.

As the carrier gas, one type of the carrier gas may be used alone, or two or more types thereof may be used in combination.

The reaction temperature of forming the silicon carbide film can be appropriately set. For example, a lower limit of the reaction temperature may be selected based on the viewpoint of improving the growth rate of the silicon carbide film and improving the productivity of the composite material. An upper limit of the reaction temperature may be selected based on the viewpoint of improving the uniformity of the silicon carbide film formed on the surface of the material forming the porous substrate.

The reaction pressure of forming the silicon carbide film may be 0.1 to 20 Torr (13 to 2660 Pa), may be 5 to 20 Torr (670 to 2660 Pa), or may be 15 to 20 Torr (2000 to 2660 Pa).

When the reaction pressure is less than a lower limit of this range, there is a possibility that the infiltration rate is low and the productivity may be decreased. When the reaction pressure is more than an upper limit of this range, there is a possibility that the infiltration into the porous substrate is insufficient and the high-temperature strength may be decreased.

A manufacturing apparatus used in the present disclosure is not particularly limited, and examples thereof include a manufacturing apparatus 100 illustrated in FIG. 1. The figures illustrated in the following description are examples, and the present disclosure is not limited thereto and can be appropriately modified within a range where the scope of the present disclosure is not changed.

The manufacturing apparatus 100 includes a tubular reaction furnace 110, a chlorine source supply unit 112, a carbon source supply unit 114, and an exhaust unit 116. The reaction furnace 110 is provided with a first reaction section 118 and a second reaction section 120 in this order from the upstream side of the reaction furnace 110.

The first reaction section 118 is a section in which the silicon source is brought into contact with the chlorine source to react with each other.

The first reaction section 118 of this example is formed by partitioning the inside of the reaction furnace 110 by two partition members 122 and 122 which have gas permeability and are spaced apart from each other in a gas flow direction. A gap between the partition members 122 is filled with a solid silicon source 300 (Si powder). As the partition member 122, a member which does not allow the Si powder to pass through and allows the chlorine source gas and the silicon source gas as a product to pass through may be used, and examples thereof include carbon felt.

The first reaction section 118 of the reaction furnace 110 is provided with a first heater 124 for adjusting a temperature at which the silicon source and the chlorine source are brought into contact with each other.

The second reaction section 120 is a section where the silicon source gas and the carbon source gas react to each other to form a silicon carbide film on a surface of each fiber of a fiber substrate 200. The form of the second reaction section 120 is not particularly limited as long as the fiber substrate 200 can be installed at a position where the silicon carbide film is formed on the surface of each fiber by the reaction between the silicon source gas and the carbon source gas.

The second reaction section 120 of the reaction furnace 110 is provided with a second heater 126 for adjusting the reaction temperature of the film formation.

The chlorine source supply unit 112 supplies the chlorine source gas. The chlorine source supply unit 112 supplies the chlorine source gas to a portion on the upstream side of the first reaction section 118 of the reaction furnace 110.

The carbon source supply unit 114 supplies the carbon source gas. The carbon source supply unit 114 supplies the carbon source gas to a portion between the first reaction section 118 and the second reaction section 120 of the reaction furnace 110. The carrier gas may be supplied together with the carbon source gas from the carbon source supply unit 114.

The exhaust unit 116 is provided on the downstream side of the reaction furnace 110 and includes a pressure regulating valve 128 and a vacuum pump 130. The exhaust unit 116 depressurizes the inside of the reaction furnace 110 by using the pressure regulating valve 128 and the vacuum pump 130 to adjust the pressure inside the reaction furnace 110 to a predetermined level.

In the production method for a composite material using the manufacturing apparatus 100, the chlorine source gas such as $Cl_2$ gas is supplied from the chlorine source supply unit 112 to the reaction furnace 110, and the chlorine source gas and the solid silicon are brought into contact with each other in the first reaction section 118. In the first reaction section 118, the silicon source gas containing $SiCl_2$ or $SiCl$ is generated as a product by bringing the chlorine source gas and the solid silicon into contact with each other, and is sent to the second reaction section 120. In the second reaction section 120, the silicon source gas that is the product in the first reaction section 118 reacts with the carbon source gas that is supplied from the carbon source supply unit 114, and the silicon carbide is deposited on the surface of each fiber of the fiber substrate 200 to form the silicon carbide film. When the fiber substrate 200 contains powder, the silicon carbide film is formed on the surface of each fiber and a surface of each powder.

The manufacturing apparatus 100 may be used for forming a silicon carbide film on a surface of each powder of a porous substrate formed of powder to obtain a composite material.

When $H_2$ gas is used as the carrier gas, the flow rate of the $H_2$ gas supplied to the reaction furnace can be appropriately set. For example, a lower limit of the flow rate of the $H_2$ gas can be selected based on the viewpoint of improving the uniformity of the silicon carbide film formed on the surface of the material forming the porous substrate.

In the production method for a composite material of the present disclosure, after the silicon carbide film is formed by the CVD method or the CVI method, the matrix of silicon carbide may be formed by a polymer impregnation and pyrolysis (PIP) method or a melt infiltration (MI) method.

According to the above described production method for a composite material of the present disclosure, a composite material in which the infiltratability of silicon carbide into the porous substrate is excellent and the uniformity of the silicon carbide film formed on the surface of the material forming the porous substrate is ensured can be produced with high productivity. The factors for obtaining such an effect are considered as follows.

In a conventional method of using MTS as a raw material gas to become a silicon source or a carbon source, methyl radicals are generated by thermal decomposition of MTS. In this case, since the methyl radicals are unstable, a film forming reaction on a surface of a porous substrate is likely to occur before the raw material gas is sufficiently infiltrated into the inside of the porous substrate, and the infiltratability of silicon carbide is lowered. On the other hand, in the present disclosure, since the silicon source and the carbon source are separately supplied to form the silicon carbide film, the generation of the methyl radicals can be suppressed. Therefore, even though the reaction temperature is raised to increase a film formation rate, the uniformity of the silicon carbide film can be ensured.

In addition, the $SiCl_2$ gas and the $SiCl$ gas are excellent in the infiltratability into the porous substrate as compared with the $SiCl_4$ gas. Therefore, when the silicon source gas containing $SiCl_2$ or $SiCl$ is used, the infiltratability of silicon carbide into the porous substrate is excellent, and the silicon carbide film can be uniformly formed in a short time.

In addition, in the conventional method, when a fiber substrate containing a fiber bundle is used, the infiltratability of silicon carbide into the inside of the fiber bundle tends to be low. However, according to the production method of the present disclosure, since the infiltratability of silicon carbide into the inside of the fiber bundle is excellent, it is possible to ensure the uniformity and achieve the productivity of the silicon carbide film even though the fiber bundle is used.

The production method for a composite material of the present disclosure is not limited to a method using the manufacturing apparatus 100. For example, instead of the first heater 124 and the second heater 126 in the manufacturing apparatus 100, a manufacturing apparatus provided with a heater that serves as both the first heater 124 and the second heater 126 may be used. In addition, a manufacturing apparatus in which the first reaction section and the second reaction section are separately provided as reaction furnaces may be used.

EXAMPLES

Hereinafter, the present disclosure will be specifically described with reference to Examples, but the present disclosure is not limited to the following descriptions.

[Film Thickness and Infiltration Rate of Silicon Carbide Film]

A cross-section of a composite material obtained in each Example was observed with an optical microscope, the film thickness of the silicon carbide film was measured at any 20 points selected, and an average thereof was calculated. The infiltration rate of the silicon carbide was obtained by dividing the film thickness of the silicon carbide film by the reaction time.

Example 1

By using the manufacturing apparatus 100 illustrated in FIG. 1, a silicon carbide film was formed on the surface of each fiber of the fiber substrate 200 to obtain a composite material.

As the fiber substrate 200, a fiber body formed by laminating 16 plain weave fabrics of silicon carbide fibers was used.

Si fine powder (trade name "SIE23PB", manufactured by Kojundo Chemical Laboratory Co., Ltd., the maximum particle diameter thereof is 5 μm) was used as the silicon source, $Cl_2$ gas was used as the chlorine source, $CH_4$ gas was used as the carbon source, and $H_2$ gas was used as the carrier gas. The $CH_4$ gas was supplied to the reaction furnace 110 together with the $H_2$ gas from the carbon source supply unit 114. The flow rate of the $Cl_2$ gas was 500 SCCM, the flow rate of the $CH_4$ gas was 120 SCCM, and the flow rate of the $H_2$ gas was 120 SCCM. The temperature at which the Si powder and the $Cl_2$ gas were brought into contact with each other in the first reaction section 118 was 1200° C., and the reaction temperature of the film formation in the second reaction section 120 was 1160° C. The pressure in the reaction furnace 110 was 20 Torr (2660 Pa), and the reaction time for the film formation was two hours.

Figure 2:
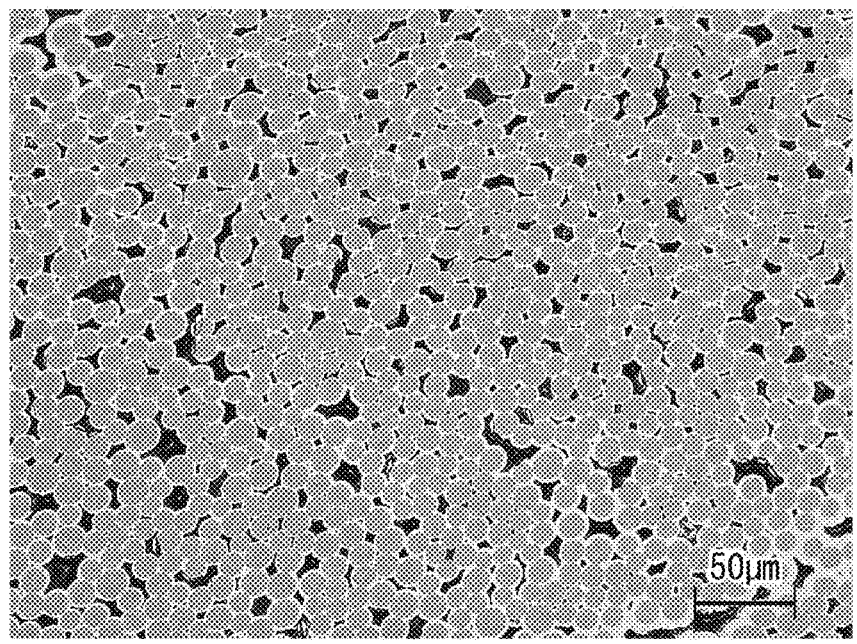
FIG. 2 is a cross-sectional photograph of a composite material obtained in Example 1.

A cross-sectional photograph of the obtained composite material is shown in FIG. 2. The average film thickness of the silicon carbide film formed on the surface of each fiber was 1.2 μm, and the infiltration rate of the silicon carbide was 0.6 μm/hr.

Comparative Example 1

By the method described below, a silicon carbide film was formed on the surface of each fiber of the fiber substrate to obtain a composite material.

A mixed gas of MTS and $H_2$ was brought into contact with the fiber substrate, which is the same as used in Example 1, at a temperature of 950° C. and a pressure of 5 Torr (670 Pa). A ratio of MTS to $H_2$ was 1:1. The reaction time was 100 hours.

Figure 3:
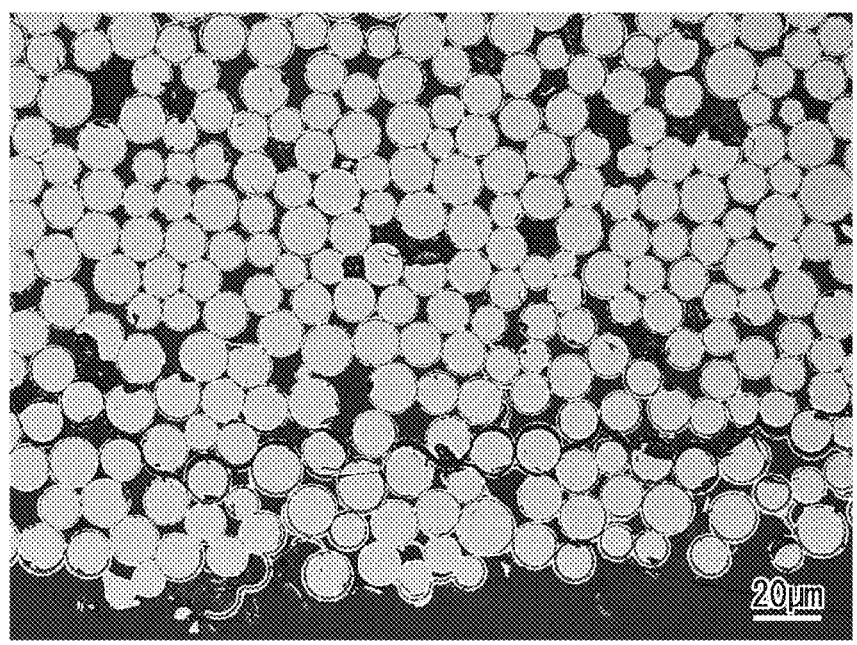
FIG. 3 is a cross-sectional photograph of a composite material obtained in Comparative Example 1.

A cross-sectional photograph of the obtained composite material is shown in FIG. 3. The average film thickness of the silicon carbide film formed on the surface of each fiber was 0.6 and the infiltration rate of the silicon carbide was 0.04 μm/hr.

The results of Example 1 and Comparative Example 1 are shown in Table 1.

TABLE 1

| | AVERAGE FILM THICKNESS OF SILICON CARBIDE FILM [μm] | INFILTRATION RATE OF SILICON CARBIDE FILM [μm/hr] |
|---|---|---|
| EXAMPLE 1 | 1.2 | 0.6 |
| COMPARATIVE EXAMPLE 1 | 0.6 | 0.04 |

As illustrated in FIGS. 2 and 3, and Table 1, in Example 1 using the production method of the present disclosure, the silicon carbide film was uniformly formed on the surface of each fiber. In addition, in Example 1, a thicker silicon carbide film was formed in a shorter time than that of Comparative Example 1 using the conventional method, and the infiltratability of silicon carbide was excellent.

Example 2

A composite material was produced in the same manner as in Example 1, except that a fiber substrate including only one plain weave fabric of the silicon carbide fibers, or a fiber substrate formed by laminating 16 plain weave fabrics of silicon carbide fibers was used, and the flow rate of the $H_2$ gas was changed to 60 SCCM, 120 SCCM, or 240 SCCM.

Figure 4:
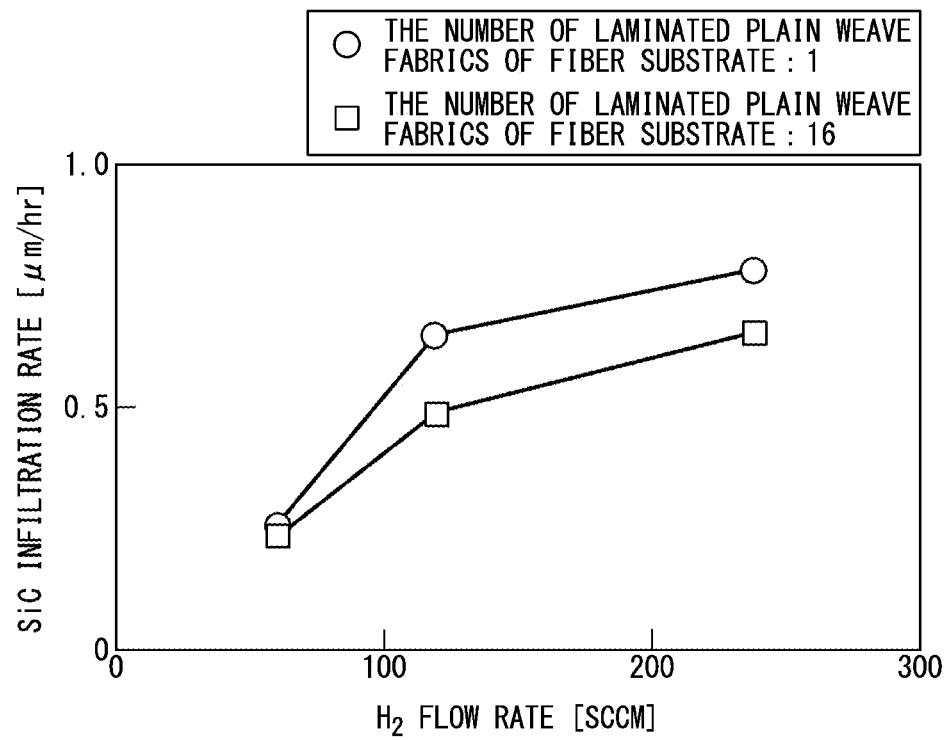
FIG. 4 is a diagram showing a correlation between a flow rate of $H_2$ gas and an infiltration rate of silicon carbide in Example 2.

FIG. 4 illustrates a graph plotting the infiltration rate of the silicon carbide with respect to the flow rate of the $H_2$ gas for each of the fiber substrates.

As illustrated in FIG. 4, the higher the flow rate of the $H_2$ gas, the higher the infiltration rate of the silicon carbide.

Experimental Example 1

Figure 5:
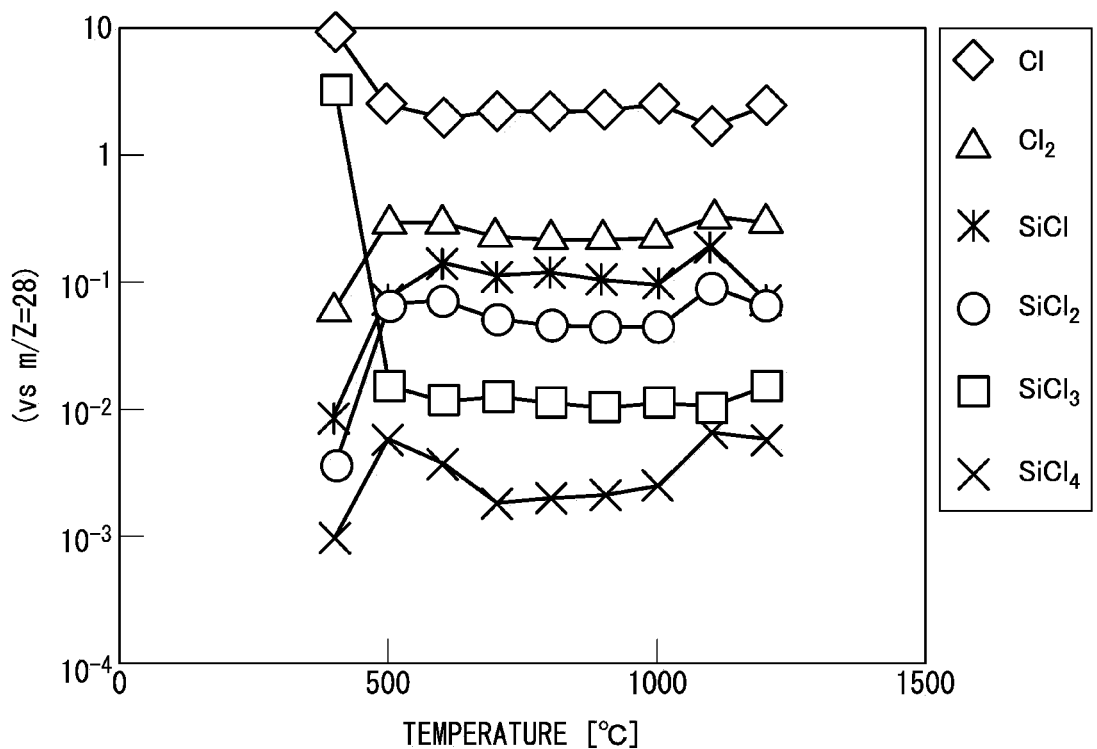
FIG. 5 is a diagram showing a correlation between the temperature in a reaction furnace and the partial pressure of each gas in Experimental Example 1.

Si powder (trade name "SIE23PB", Kojundo Chemical Laboratory Co., Ltd., the maximum particle diameter thereof is 5 μm) was filled in the reaction furnace, the $Cl_2$ gas was supplied to the reaction furnace to etch the Si powder, a gas obtained by this reaction was collected from an exhaust pipe and was analyzed by a mass spectrometer to obtain the partial pressure of each constituent gas. The partial pressure of each constituent gas was measured by changing the temperature in the reaction furnace from 400° C. to 1200° C. FIG. 5 illustrates a graph plotting the partial pressure of each constituent gas with respect to the temperature in the reaction furnace.

As illustrated in FIG. 5, the partial pressure of the $Cl_2$ gas was decreased by two orders of magnitude in a case where the temperature of the reaction furnace was in the range of 400° C. to 500° C. From this result, it is considered that the $Cl_2$ gas has a thermal decomposition temperature in a range of 400° C. to 500° C., and $Cl^-$ exists in a gas generation field of 500° C. or higher.

Experimental Example 2

Under the condition that the filling amount of the Si powder in the reaction furnace and the contact time between the Si powder and the $Cl_2$ gas were constant and the temperature in the reaction furnace was changed to 800° C., 1000° C., 1100° C., or 1200° C., the Si powder was etched in the same manner as in Experimental Example 1.

Figure 6:
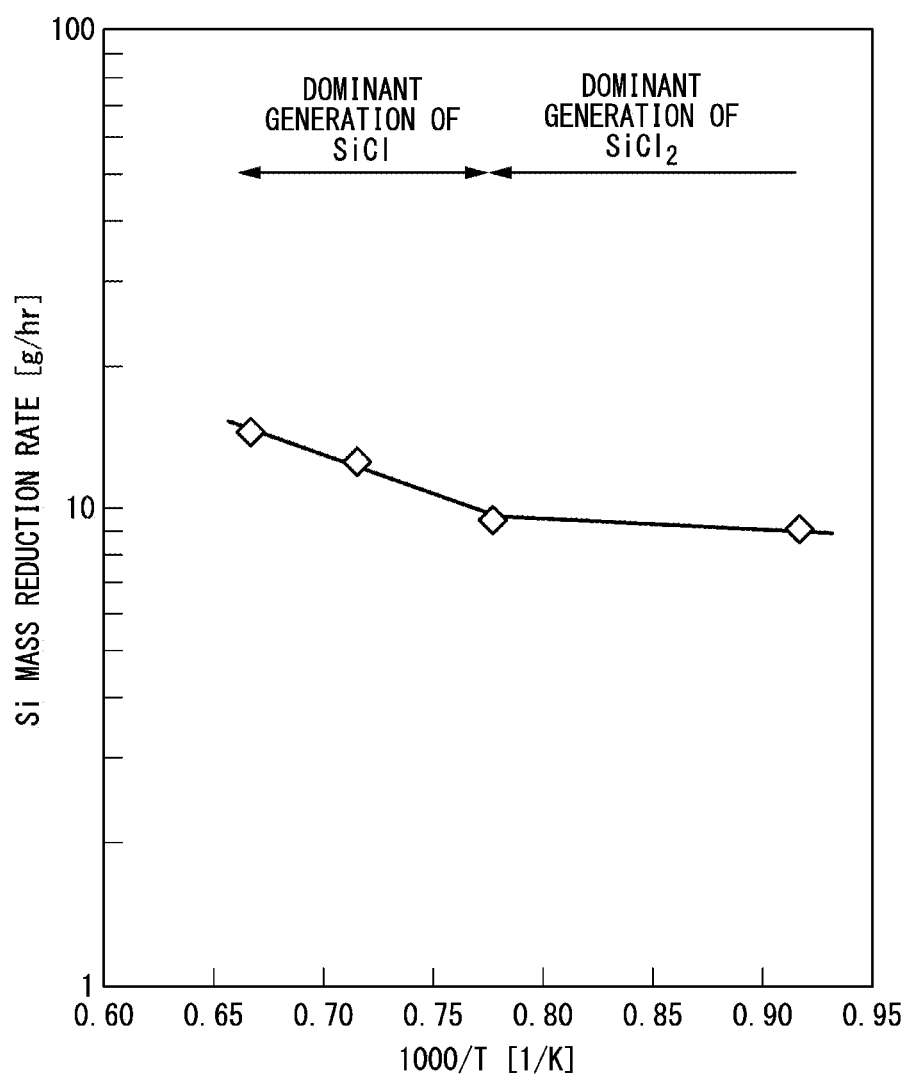
FIG. 6 is a diagram showing an Arrhenius plot of the mass reduction amount of Si powder in Experimental Example 2.
Figure 7:
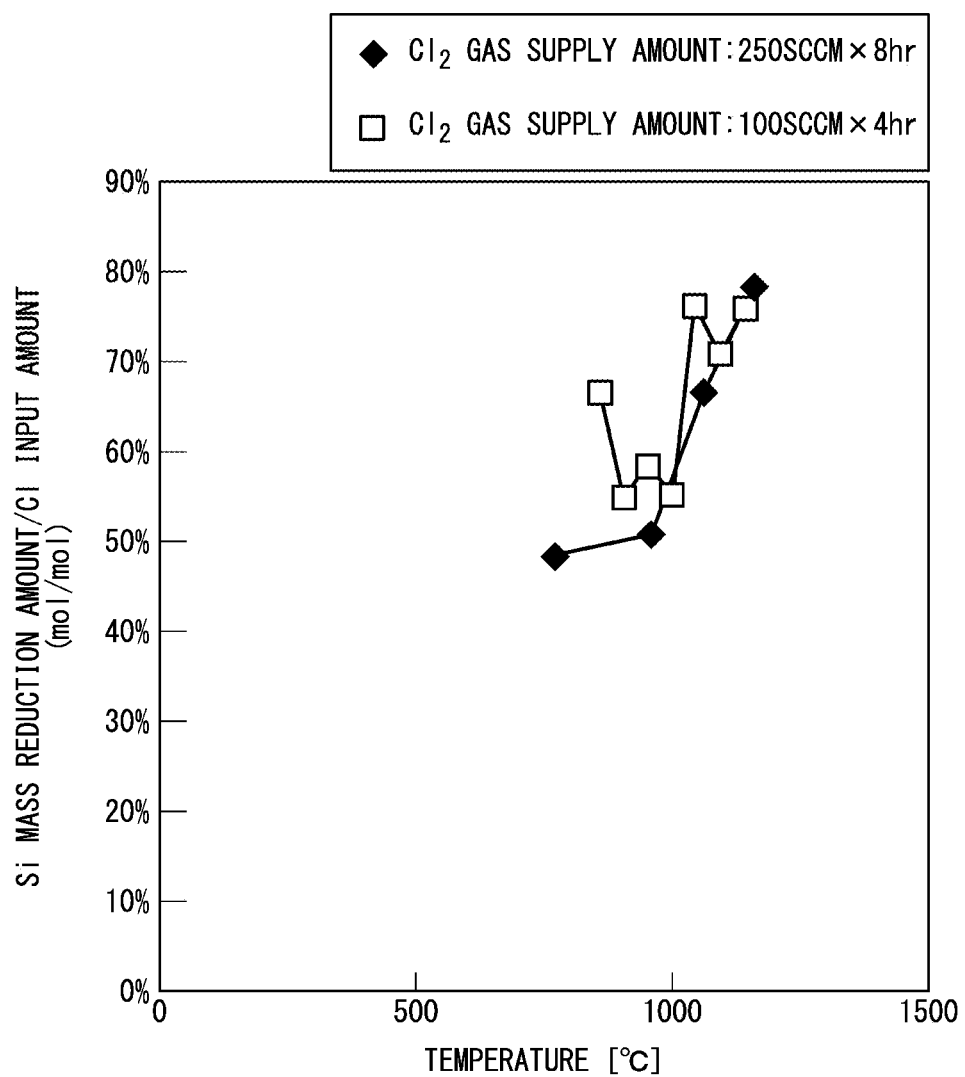
FIG. 7 is a diagram showing a change in a mass balance between the mass reduction amount of Si powder and the input amount of $Cl_2$ gas in Experimental Example 2.

The mass of the Si powder before and after the reaction was measured at each temperature, and the temperature dependence of the mass reduction amount of the Si powder was determined. FIG. 6 illustrates an Arrhenius plot of the mass reduction amount of the Si powder. FIG. 7 illustrates a correlation between the temperature in the reaction furnace and the ratio of the mass reduction amount of the Si powder to the input amount of Cl. When the ratio of the mass reduction amount of the Si powder to the input amount of Cl is 100%, all of the input Cl becomes SiCl.

As illustrated in FIG. 6, the inclination in the plot of the mass reduction of the Si powder was changed at about 1000° C. It is considered that this result indicates that, in the generation of $SiCl_2$ and SiCl by bringing the Si powder into contact with the $Cl_2$ gas, $SiCl_2$ is dominantly generated at a temperature below the boundary of about 1000° C., and SiCl is dominantly generated at a temperature above the boundary of about 1000° C.

In addition, as illustrated in FIG. 7, the ratio of the mass reduction amount of the Si powder to the input amount of Cl was more than 50% at a temperature of about 1050° C. or higher. This result indicates that a main product gas generated in this temperature range is SiCl.

The present disclosure can be applied to a production method for a composite material including a porous substrate and a silicon carbide film formed on a surface of a material forming the porous substrate.

What is claimed is:

1. A production method for a composite material including a porous substrate and a silicon carbide film formed on a surface of a material forming the porous substrate, the method comprising:
   providing a first reaction section and a second reaction section in this order from an upstream side of a reaction furnace,
   filling a solid silicon source containing a silicon atom in the first reaction section,
   supplying a chlorine source gas containing a chlorine atom to a portion on an upstream side of the first reaction section,
   generating a silicon source gas containing $SiCl_2$ or SiCl by bringing the solid silicon source into contact with the chlorine source gas at the first reaction section,
   supplying a carbon source gas containing a carbon atom to a portion between the first reaction section and the second reaction section, and
   causing the silicon source gas containing SiC12 or SiCl and the carbon source gas to react with each other at the second reaction section to form the silicon carbide film on the surface of the material, and
   wherein no carbon source gas containing a carbon atom is supplied to a portion on an upstream side of the portion between the first reaction section and the second reaction section.

2. The production method for a composite material according to claim 1, wherein the silicon carbide film is formed by the reaction using a chemical vapor deposition method or a chemical vapor infiltration method.

3. The production method for a composite material according to claim 1, wherein a reaction pressure for forming the silicon carbide film is 0.1 to 20 Torr.

4. The production method for a composite material according to claim 1, wherein the carbon source is at least one hydrocarbon of $CH_4$, $C_2H_6$, $C_3H_8$, $C_2H_4$, $C_2H_2$, $C_6H_6$, and $CCl_4$.

5. The production method for a composite material according to claim 1, wherein the porous substrate is a fiber substrate including a plurality of fibers.

6. The production method for a composite material according to claim 5, wherein the fiber is a silicon carbide fiber.

7. The production method for a composite material according to claim 1, wherein an inside of the reaction furnace is exhausted by an exhaust unit from the upstream side to a downstream side of the reaction furnace.

* * * * *